(12) United States Patent
Seo et al.

(10) Patent No.: US 9,564,590 B2
(45) Date of Patent: Feb. 7, 2017

(54) VARIABLE MASK

(71) Applicant: Samsung Display Co., Ltd., Yongin, Gyeonggi-Do (KR)

(72) Inventors: Tae An Seo, Hwaseong-si (KR); Bo Ik Park, Uiwang-si (KR); Ju Chan Park, Seoul (KR); Young Gug Seol, Hwaseong-si (KR); Pil Suk Lee, Seoul (KR); Jin Hwan Choi, Seoul (KR)

(73) Assignee: Samsung Display Co., Ltd., Yongin (KR)

( * ) Notice: Subject to any disclaimer, the term of this patent is extended or adjusted under 35 U.S.C. 154(b) by 0 days.

(21) Appl. No.: 14/803,704

(22) Filed: Jul. 20, 2015

(65) Prior Publication Data

US 2016/0225995 A1  Aug. 4, 2016

(30) Foreign Application Priority Data

Jan. 29, 2015  (KR) ........................ 10-2015-0014349

(51) Int. Cl.
*H01L 51/00* (2006.01)
*H01L 51/56* (2006.01)
*G03F 1/42* (2012.01)

(52) U.S. Cl.
CPC ............. *H01L 51/0011* (2013.01); *G03F 1/42* (2013.01); *H01L 51/56* (2013.01)

(58) Field of Classification Search
None
See application file for complete search history.

(56) References Cited

U.S. PATENT DOCUMENTS

| 8,192,920 B2 | 6/2012 | Kobrin |
| 8,318,386 B2 | 11/2012 | Kobrin |
| 2007/0258076 A1* | 11/2007 | Maria Derksen et al. ................... G03F 7/70216 355/67 |

FOREIGN PATENT DOCUMENTS

| KR | 10-2006-0103629 A | 10/2006 |
| KR | 10-2011-0008159 A | 1/2011 |
| KR | 10-2012-0004118 A | 1/2012 |

* cited by examiner

*Primary Examiner* — Fernando L Toledo
*Assistant Examiner* — Valerie N Newton
(74) *Attorney, Agent, or Firm* — Knobbe Martens Olson & Bear LLP (57) ABSTRACT

A mask comprises a mask frame defining an opening; a plurality of support bars installed in the opening of the mask frame; a plurality of movable bars, each of which is installed over a corresponding one of the plurality of support bars and movable relative to the corresponding support bar, wherein the plurality of support bars and the plurality of movable bars are arranged to divide the opening into a plurality of mask holes; and a plurality of actuators installed between the plurality of movable bars and the corresponding support bars and configured to move the movable bars relative to the plurality of support bars.

20 Claims, 6 Drawing Sheets

VARIABLE MASK

CROSS-REFERENCE TO RELATED APPLICATION

This application claims priority to and the benefit of Korean Patent Application No. 10-2015-0014349 filed in the Korean Intellectual Property Office on Jan. 29, 2015, the entire contents of which are incorporated herein by reference.

BACKGROUND (a) Field

The present disclosure relates to a variable mask in which a mask pattern may be changed.

(b) Discussion of the Related Technology

As a flat panel display, a liquid crystal display (LCD) and an organic light emitting device (OLED) are known. The flat panel display includes metal layers with particular patterns, organic emission layers with particular patterns, insulating layers, or the like.

In order to form the metal layers, the organic emission layer, the insulating layers, or the like, a deposition method or an exposure method, which uses a mask assembly, is used.

As the mask assembly, a pattern mask assembly, which has pattern openings that are formed in the same shape as the metal layers or the organic emission layers that will be deposited or exposed, is used.

However, in a case in which it is necessary to change the shape of the mask pattern of the mask assembly, the entire mask assembly needs to be replaced, and as a result, excessive costs may be incurred to replace the mask assembly.

The above information disclosed in this Background section is only for enhancement of understanding of the background of the disclosure and therefore it may contain information that does not form the prior art that is already known in this country to a person of ordinary skill in the art.

SUMMARY

The present disclosure has been made in an effort to provide a variable mask in which a shape of a mask pattern may be changed, thereby compensating for an error in alignment of the mask, and reducing costs for replacement.

One aspect of the invention provides a mask, which may comprise: a mask frame defining an opening; a plurality of support bars installed in the opening of the mask frame; a plurality of movable bars, each of which is installed over a corresponding one of the plurality of support bars and movable relative to the corresponding support bar, wherein the plurality of support bars and the plurality of movable bars are arranged to divide the opening into a plurality of mask holes; and a plurality of actuators installed between the plurality of movable bars and the corresponding support bars and configured to move the movable bars relative to the plurality of support bars.

In the foregoing mask, the plurality of support bars may comprise: a plurality of first support bars arranged in a first direction and extending in a second direction that intersects the first direction; and a plurality of second support bars placed above the first support bars, arranged in the second direction, and extending in the first direction. Each first support bar may comprise: a base portion; and a support portion attached to the base portion and supporting at least part of the plurality of second support bars. The plurality of second support portions may be installed above the support portion in the state of being spaced apart from the base portion. The plurality of movable bars may comprise: a first movable bars, each of which is slidably installed over the base portion; and a second movable bars, each of which is slidably installed over a corresponding one of the second support bars.

Still in the foregoing mask, the actuators may comprise: a plurality of first piezoelectric elements, each of which is installed between the base portion and a corresponding one of the first movable bars, and configured to expand or contract in the first direction to move the first variable bar; and a plurality of second piezoelectric elements, each of which is installed between one of the second support bars and a corresponding one of the second movable bars, and configured to expand or contract in the second direction to move the corresponding second movable bar. The plurality of first piezoelectric elements may be arranged in the second direction with a first interval. The plurality of second piezoelectric elements may be arranged in the first direction at a second interval. Each movable bar may have a straight line shape. Each movable bar may comprise at least one part having a rounded shape.

Yet in the foregoing mask, the plurality of support bars may comprise a first support bar extending in a first direction, wherein the plurality of movable bars comprise a first movable bar placed over the first support bar and extending in the first direction, the first movable bar being configured to move relative to the first support bar in a second direction which is substantially perpendicular to the first direction such that the movement of the first movable bar adjusts the size, location or shape of at least one of the mask holes. The first movable bar may have a width which is a distance between two opposite edges thereof measured in the second direction and is substantially same as or substantially smaller than that of the first support bar. The plurality of support bars comprise a second support bar extending in the second direction and configured to support the first support bar. The first support bar may be disposed between the first movable bar and the second support bar at their overlapping location. The first movable bar may be disposed between the first and second support bars at their overlapping location.

Further in the foregoing mask, the plurality of support bars may comprise a second support bar extending in the second direction, wherein the plurality of movable bars comprise a second movable bar placed over the second support bar and extending in the first direction, the second movable bar being configured to move relative to the second support bar in the first direction such that the movement of the first movable bar adjusts the size or shape of at least one of the mask holes. The second movable bar may have a width which is a distance between two opposite edges thereof measured in the first direction and is substantially same as or substantially smaller than that of the second support bar. The first support bar may be disposed between the first movable bar and the second support bar at an overlapping location. The first and second support bars may be disposed between the first and second movable bars at an overlapping location.

Another aspect of the invention provides a method of making a display device, which may comprise: providing the foregoing mask; moving the first movable bar relative to the first support bar, thereby adjusting the size of at least one of the mask holes; providing a substrate; placing the mask over the substrate; depositing a deposition material over the substrate using the mask, wherein the deposition material passing the mask holes is deposited predetermined areas. In the foregoing method, the deposition material may be an organic light emitting material.

An embodiment provides a variable mask including: a mask frame which has an opening formed therein; a plurality of support portions which is installed in the opening of the mask frame; pattern bars which are movably installed on the support portions and divide the opening into a plurality of divided openings; and pressing members which are installed between the support portions and the pattern bars and move the pattern bars.

The support portions may include: a plurality of first support portions which is installed in a first direction of the mask frame; and a plurality of second support portions which is installed above the first support portions in a second direction that intersects with the first direction.

The first support portions may include: a plurality of pattern support portions which is installed in the first direction of the mask frame; and pattern base portions which are installed to protrude from sides of the pattern support portions.

The plurality of second support portions may be installed in the second direction above the pattern support portion in the state of being spaced apart from the pattern base portions.

The pattern bar may include: a first variable bar which is slidably installed on the pattern base portion; and a second variable bar which is slidably installed on the second support portion.

The pressing member may include: a first piezoelectric element which is installed between the pattern base portion and the first variable bar, and expanded or contracted in the first direction to move the first variable bar; and a second piezoelectric element which is installed between the second support portion and the second variable bar, and expanded or contracted in the second direction to move the second variable bar.

The plurality of first piezoelectric elements may be installed at equal intervals between the pattern base portions and the first variable bars.

The plurality of second piezoelectric elements may be installed at equal intervals between the second support portions and the second variable bars.

The pattern bar may have a straight line shape.

The pattern bar may include at least one part having a rounded shape.

According to the embodiment, it is possible to change the shape of the pattern of the variable mask, whereby even when it is necessary to change the size of the pattern, it is possible to use a single mask to cope with the necessity, thereby reducing costs required to additionally purchase the mask.

According to the embodiment, even though an error in alignment of the variable mask occurs, it is possible to easily correct the error in alignment by changing the shape of the pattern.

According to the embodiment, it is possible to change the shape of the pattern of the variable mask into various shapes such as a quadrangular shape or a rounded shape, thereby providing an efficient variable mask.

DETAILED DESCRIPTION OF THE EMBODIMENTS

Hereinafter, an embodiment will be described in detail with reference to the accompanying drawings so that those with ordinary skill in the art to which the present disclosure pertains may easily carry out the embodiment. As those skilled in the art would realize, the described embodiments may be modified in various different ways, all without departing from the spirit or scope of the present disclosure. The drawings and description are to be regarded as illustrative in nature and not restrictive. Like reference numerals designate like elements throughout the specification.

Figure 1:
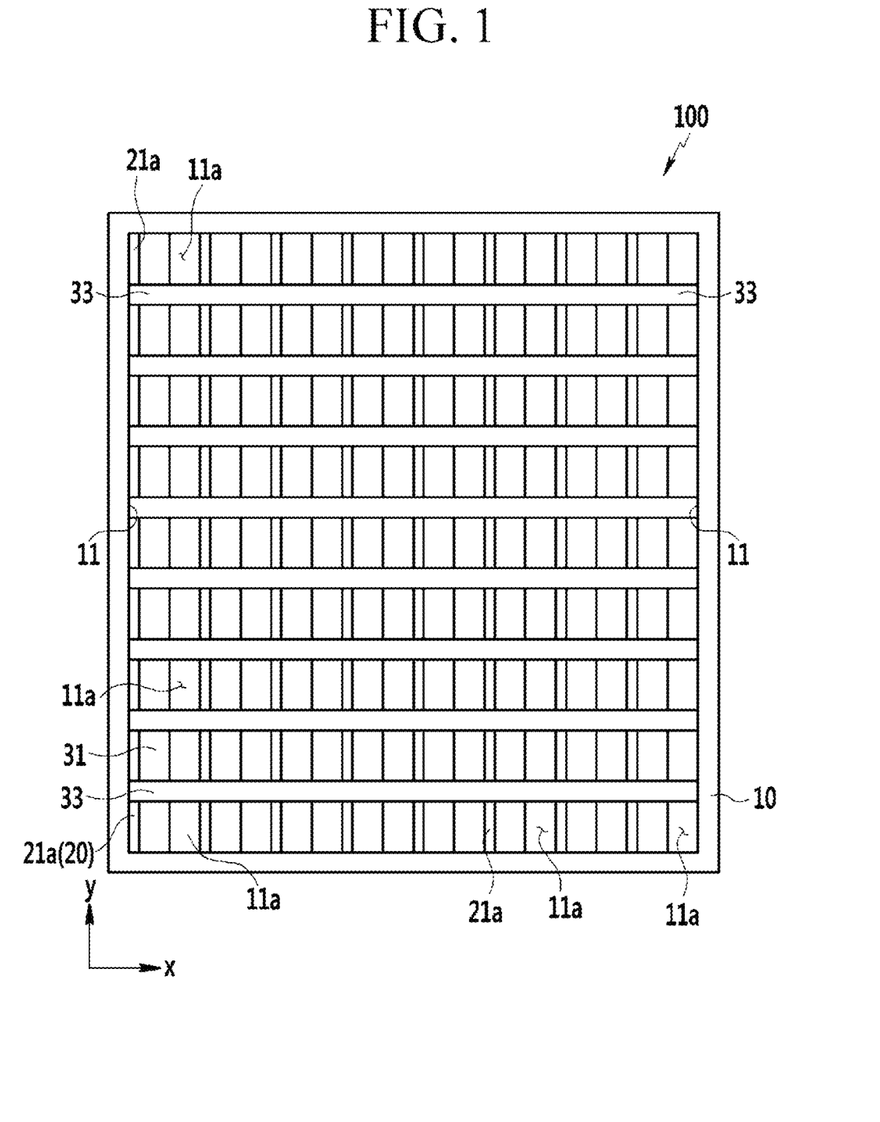
FIG. 1 is a top plan view schematically illustrating a variable mask according to an embodiment.
Figure 2:
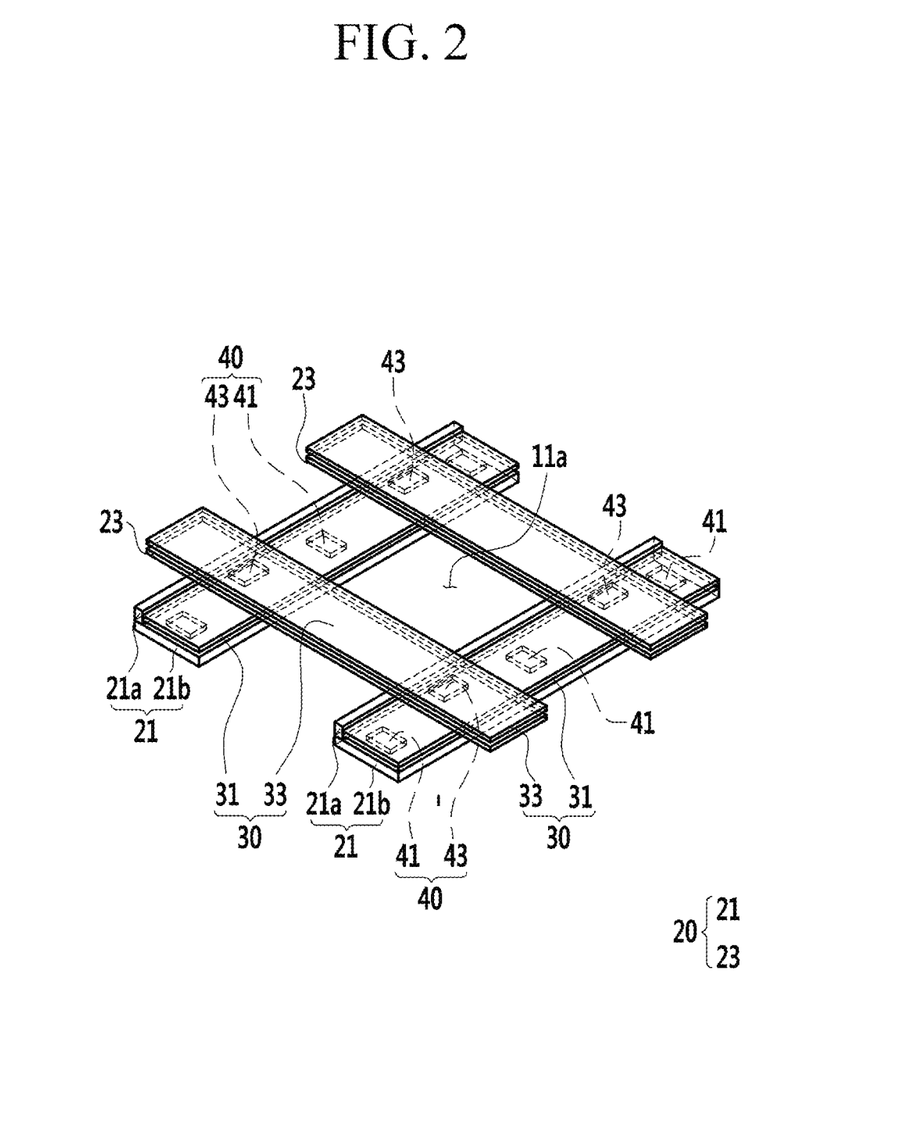
FIG. 2 is a perspective view schematically illustrating a part of a main part of the variable mask of FIG. 1.
Figure 3:
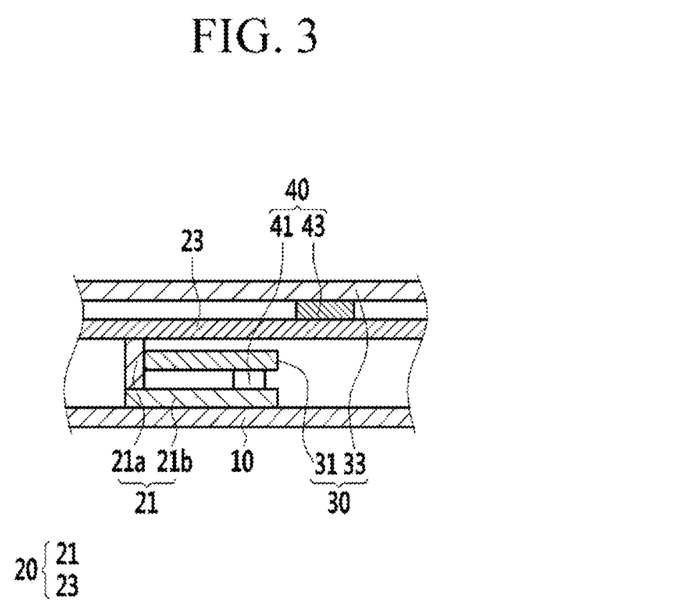
FIG. 3 is a cross-sectional view schematically illustrating a part of the variable mask of FIG. 2.

FIG. 1 is a top plan view schematically illustrating a variable mask according to an embodiment, FIG. 2 is a perspective view schematically illustrating a part of a main part of the variable mask of FIG. 1, and FIG. 3 is a cross-sectional view schematically illustrating a part of the variable mask of FIG. 2.

As illustrated in FIGS. 1 to 3, a variable mask 100 according to an embodiment includes a mask frame 10 which has an opening 11 formed therein, a plurality of support portions or support bars 20 which is installed in the opening 11 of the mask frame 10, pattern bars or movable bars 30 which are slidably installed on the support portions 20 and divide the opening 11 into a plurality of divided openings or mask holes 11a, and pressing members or actuators 40 which are installed between the support portions 20 and the pattern bars 30 and move the pattern bars 30.

The opening 11 is formed at a center of the mask frame 10. As the mask frame 10, a mask frame, which is applied to a mask for exposure, will be illustratively described. However, the mask frame 10 is not necessarily limited to being applied to the mask for exposure, but may be applied to an organic deposition mask. The support portions 20 are installed above the mask frame 10.

The support portions 20 are installed above the mask frame 10, and support the pattern bars 30. More specifically, the support portion 20 may include a first support portion 21 which is installed on the mask frame 10, and a second support portion 23 which is installed to intersect with the first support portion 21.

A plurality of first support portions or support bars 21 may be installed at substantially equal intervals so as to have a long length in a first direction (y) of the mask frame 10. More specifically, each first support portion 21 may include a pattern support portion 21a which is installed on the mask frame 10 at substantially equal intervals, and a pattern base portion 21b which is installed to protrude from sides of the pattern support portions 21a.

The pattern support portion 21a is installed on the mask frame 10 to support the second support portion 23. The pattern support portion 21a may have a quadrangular cross section, and may be made of an insulating material.

The plurality of pattern support portions 21a protrudes upward from the mask frame 10, and may be installed to divide the opening 11 at equal intervals. The pattern base portions 21b may protrude from the sides of the pattern support portions 21a.

The pattern base portion 21b may be installed to protrude from the longitudinal side of the pattern support portion 21a. The pattern base portion 21b may be made of the same insulating material as the pattern support portion 21a.

In an initial state in which the pressing member 40 is not operated, the pattern base portions 21b may divide the opening 11 of the mask frame 10 into a plurality of openings.

In the present embodiment, in a state in which the pressing member 40 is not operated, the opening 11 of the mask frame 10 may be divided into a plurality of divided openings by portions between sides of the pattern base portions 21b and sides of the pattern support portions 21a.

Meanwhile, the second support portion 23 may be installed above the pattern support portion 21a.

A plurality of second support portions 23 may be installed to have a long length in a direction in which the second support portions 23 intersect with the pattern support portions 21a in a second direction (x) that intersects with the first direction (y), The second support portions 23 intersect with or overlap the first support portions 21a at their overlapping locations when viewed in a viewing direction an upper surface of each of the second support portions or the first support portions. The second support portion 23 may be formed to have the same width as the pattern base portion 21b.

In the present embodiment, in an initial state in which the pressing member 40 is not operated, the second support portions 23, together with the pattern base portions 21b, may divide the opening 11 of the mask frame 10 into the plurality of divided openings 11a.

In embodiments, in an initial state in which the pressing member 40 is not operated, the opening 11 of the mask frame 10 may be divided into the divided openings 11a, which are disposed in a plurality of columns and rows, by the pattern base portions 21b and the second support portions 23.

When changing sizes of the divided openings 11a, the pattern bars 30 slide or move by operating the pressing members 40, thereby changing the sizes of the divided openings 11a. Hereinafter, the aforementioned operations will be more specifically described while the pattern bars 30 and the pressing members 40 are described.

The pattern bar 30 may include a first variable bar or movable bar 31 which is slidably or movably installed on the pattern base portion 21b, and a second variable bar or movable bar 33 which is slidably or movably installed on the second support portion 23.

The first variable bar 31 may be formed to have the same length as the pattern base portion 21b, and slidably installed on the pattern base portion 21b. As such, the first variable bars 31 are slidably installed on the pattern base portions 21b in order to change the sizes in the second direction (x) of the divided openings 11a of the mask frame 10.

The second variable bar 33 may be formed to have the same length as the second support portion 23, and slidably installed on the second support portion 23. As such, the second variable bars 33 are slidably installed on the second support portions 23 in order to change the sizes in the first direction (y) of the divided openings 11a of the mask frame 10.

Meanwhile, the first variable bars 31 and the second variable bars 33 may be moved by operating the pressing members 40.

The pressing member 40 may include a first piezoelectric element 41 which moves the first variable bar 31, and a second piezoelectric element 43 which moves the second variable bar 33.

In embodiments, the plurality of first piezoelectric elements 41 may be installed at substantially equal intervals between the pattern base portions 21b and the first variable bars 31, and expanded or contracted in the second direction (x) to move the first variable bars 31. In embodiments, the first piezoelectric element 41 is expanded or contracted when an electric signal is input to the first piezoelectric element 41, thereby moving the first variable bar 31.

Figure 4:
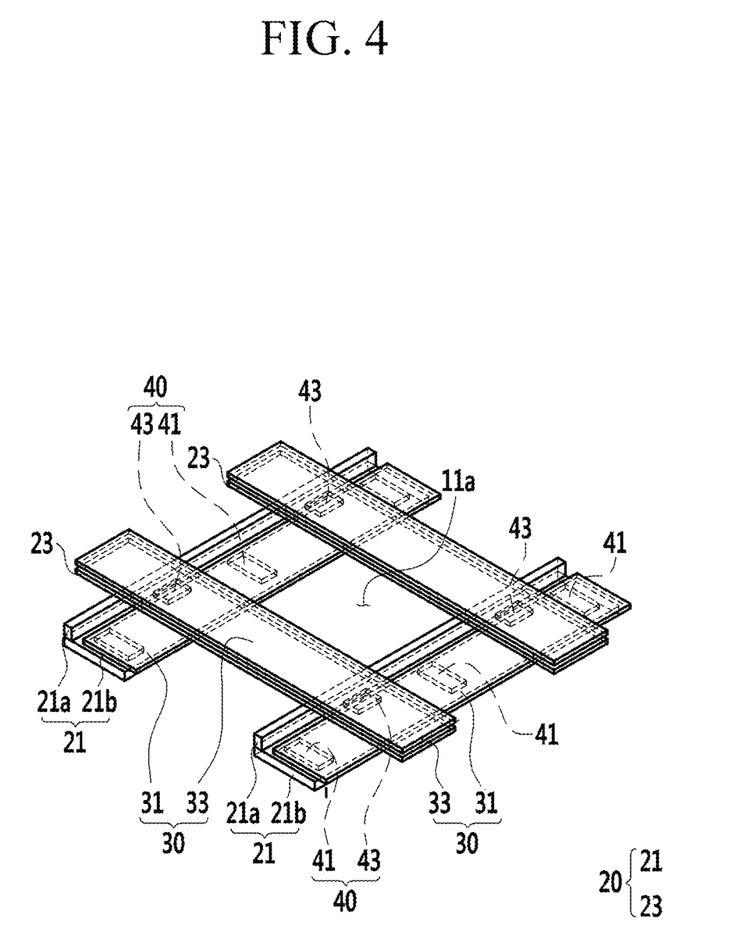
FIG. 4 is a perspective view schematically illustrating a main part in a state in which a first variable bar of the variable mask of FIG. 2 is moved.

FIG. 4 is a perspective view schematically illustrating a main part in a state in which the first variable bar of the variable mask of FIG. 2 is moved.

As illustrated in FIG. 4, the first variable bars 31 are moved in the second direction (x) in the opening 11 of the mask frame 10, thereby selectively changing the sizes of the divided openings 11a.

In embodiments, the plurality of second piezoelectric elements 43 may be installed at equal intervals between the second support portions 23 and the second variable bars 33, and expanded or contracted in the first direction (y) to move the second variable bars 33. In embodiments, the second piezoelectric element 43 is expanded or contracted when an electric signal is input to the second piezoelectric element 43, thereby moving the second variable bar 33. In embodiments, the actuators may be located at the overlapping locations.

Figure 5:
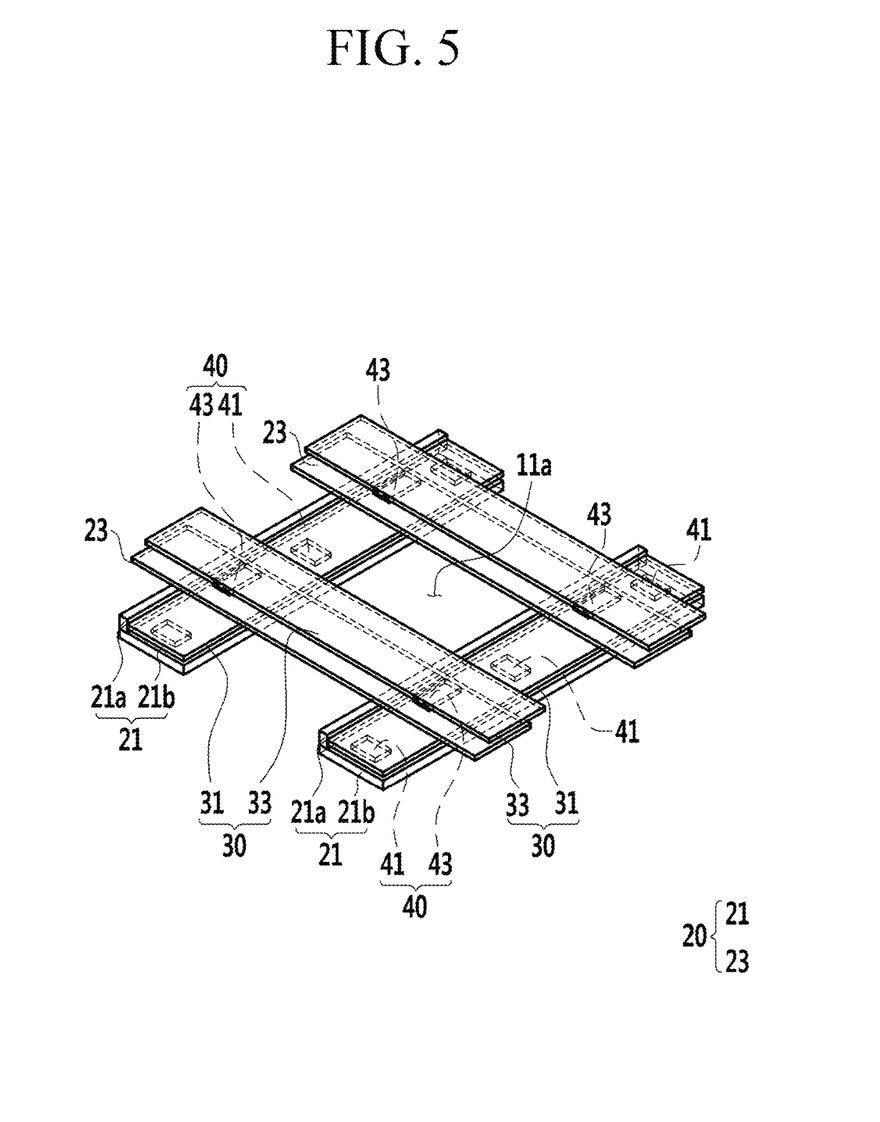
FIG. 5 is a perspective view schematically illustrating a main part in a state in which a second variable bar of the variable mask of FIG. 2 is moved.

FIG. 5 is a perspective view schematically illustrating a main part in a state in which the second variable bar of the variable mask of FIG. 2 is moved.

As illustrated in FIG. 5, the second variable bars 33 are moved in the first direction (y) in the opening 11 of the mask frame 10, thereby selectively changing the sizes of the divided openings 11a.

Figure 6:
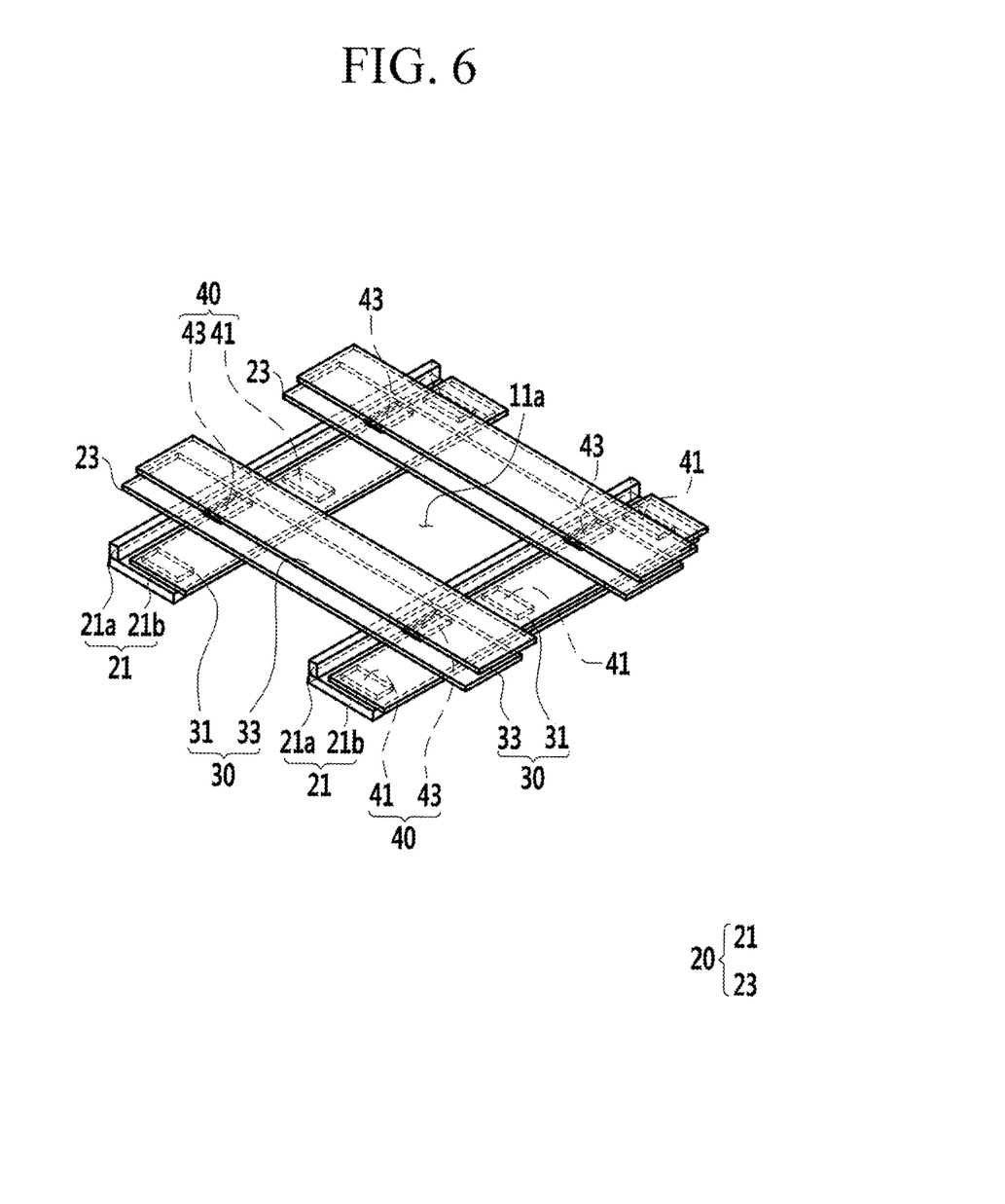
FIG. 6 is a perspective view schematically illustrating a main part in a state in which the first variable bar and the second variable bar of the variable mask of FIG. 2 are moved together.

FIG. 6 is a perspective view schematically illustrating a main part in a state in which the first variable bar and the second variable bar of the variable mask of FIG. 2 are moved together.

As illustrated in FIG. 6, the first variable bars 31 are moved in the second direction (x) in the opening 11 of the mask frame 10, and the second variable bars 33 are moved in the first direction (y) in the opening 11 of the mask frame 10. The first variable bars 31 and the second variable bars 33 may be moved by operating both the first piezoelectric elements 41 and the second piezoelectric elements 43.

In embodiments, all the first variable bars 31 and the second variable bars 33 may be simultaneously moved by operating both the first piezoelectric elements 41 and the second piezoelectric elements 43 to reduce the sizes of all the mask holes. In alternative embodiments, only one among the first variable bars 31 and the second variable bars 33 may be moved to adjust the sizes of a few mask holes.

Therefore, the sizes of the divided openings 11a may be decreased by the movements of the first variable bars 31 and the second variable bars 33.

As described above, the opening 11 of the mask frame 10 may be divided into the quadrangular divided openings 11a by the first variable bars 31 and the second variable bars 33 in a state in which the divided openings 11a have the changed sizes.

Here, the sizes of the divided openings 11a may be variously changed so that the divided openings 11a have a quadrangular shape, a rectangular shape, or the like, by changing distances which the first variable bars 31 or the second variable bars 33 are moved.

The purpose of changing positions of the first variable bars 31 and the second variable bars 33, as described above, is to partially change the shape of the pattern of the divided openings 11*a*, and to compensate for an error in alignment of the variable mask 100 when the error in alignment occurs.

In addition, when changing the pattern of the mask, it is possible to change the shapes of the divided openings 11*a* of the variable mask 100 by changing the positions of the first variable bars 31 and the second variable bars 33, thereby reducing costs required to purchase the mask.

Meanwhile, the variable mask 100 of the present embodiment has been illustratively described as being applied to a horizontal type mask, but the present disclosure is not necessarily limited thereto, and the variable mask 100 may be applied to various masks such as a vertical type mask, a roll type mask, or a curved mask.

In addition, according to the variable mask 100 of the present embodiment, the divided opening 11*a* having a quadrangular shape has been illustratively described, but the present disclosure is not necessarily limited thereto, and the divided openings 11*a* may have various shapes such as a rounded shape, an elliptical shape, a triangular shape, a honeycomb shape, or the like, by changing the shape of the pattern bar 30 into a diagonal shape or a rounded shape.

In embodiments, a controller may be provided to control the operation of the piezoelectric elements 41 and 43. The controller is electrically connected to piezoelectric elements 41 and 43 and is capable of controlling the supply of the electricity to the elements 41 and 43. In one embodiment, the controller may control the actuators 40 attached to one of the movable bars 30 such that such actuators 40 make substantially the same amount of the expansion, thereby making parallel displacement of that movable bar relative to the corresponding support bar. In another embodiment, the controller may control the actuators 40 attached to one of the movable bars 30 such that such actuators 40 make substantially different amounts of the expansion, thereby making a slight rotational displacement of that movable bar relative to the corresponding support bar.

In embodiments, the controller can be attached to the mask. In alternative embodiments, the controller may be separate from the mask body and be connected to a terminal formed in the mask using, for example, a flexible wire connector.

In embodiments, the mask may be used in a method of making a display panel, such as an LCD display and an organic light emitting display device. In one embodiment, the organic light emitting display device includes a plurality of pixels formed over a substrate. Each pixel includes an organic light emitting layer is disposed between an anode and a cathode. For forming the organic light emitting layers, an organic light emitting material is deposited using the mask having a structure according to embodiments discussed above.

In making an organic light emitting display device, an organic light emitting material may be deposited over the substrate. The mask is placed between a deposition material supplier and the substrate. The holes of the mask are adjusted before or after placing the mask between the deposition material supplier and the substrate. As discussed above, the holes are adjusted by operating the actuators 40 and moving the movable bars 30 in size or shape.

Subsequently placing the mask and adjusting the holes, the deposition material is supplied through the holes and deposited over the substrate, thereby forming the light emitting layers having a predetermined size at predetermined locations. When there are errors in some light emitting layers in size or location, the holes may be adjusted by moving the corresponding movable bars 30. The deposit material may be a metal in another embodiment.

While this disclosure has been described in connection with what is presently considered to be practical embodiments, it is to be understood that the disclosure is not limited to the disclosed embodiments, but, on the contrary, is intended to cover various modifications and equivalent arrangements included within the spirit and scope of the appended claims.

What is claimed is:

1. A mask comprising:
   a mask frame defining an opening;
   a plurality of support bars installed in the opening of the mask frame, wherein the plurality of support bars are arranged to divide the opening into a plurality of mask holes;
   a plurality of movable bars, each of which is installed over a corresponding one of the plurality of support bars and movable relative to the corresponding support bar, wherein the plurality of movable bars are arranged to divide the opening into a plurality of mask holes; and
   a plurality of actuators installed between the plurality of movable bars and the corresponding support bars and configured to move the movable bars relative to the plurality of support bars.

2. The mask of claim 1, wherein the plurality of support bars comprise:
   a plurality of first support bars arranged in a first direction and extending in a second direction that intersects the first direction; and
   a plurality of second support bars placed above the first support bars, arranged in the second direction, and extending in the first direction.

3. The mask of claim 2, wherein each first support bar comprises:
   a base portion; and
   a support portion attached to the base portion and supporting at least part of the plurality of second support bars.

4. The mask of claim 3, wherein the plurality of second support portions is installed above the support portion in the state of being spaced apart from the base portion.

5. The mask of claim 4, wherein the plurality of movable bars comprise:
   a first movable bars, each of which is slidably installed over the base portion; and
   a second movable bars, each of which is slidably installed over a corresponding one of the second support bars.

6. The mask of claim 5, wherein the actuators comprise:
   a plurality of first piezoelectric elements, each of which is installed between the base portion and a corresponding one of the first movable bars, and configured to expand or contract in the first direction to move the first variable bar; and
   a plurality of second piezoelectric elements, each of which is installed between one of the second support bars and a corresponding one of the second movable bars, and configured to expand or contract in the second direction to move the corresponding second movable bar.

7. The mask of claim 6, wherein the plurality of first piezoelectric elements are arranged in the second direction with a first interval.

8. The mask of claim 6, wherein the plurality of second piezoelectric elements are arranged in the first direction at a second interval.

9. The mask of claim 1, wherein each movable bar has a straight line shape.

10. The mask of claim 1, wherein each movable bar comprises at least one part having a rounded shape.

11. The mask of claim 1, wherein the plurality of support bars comprise a first support bar extending in a first direction, wherein the plurality of movable bars comprise a first movable bar placed over the first support bar and extending in the first direction, the first movable bar being configured to move relative to the first support bar in a second direction which is substantially perpendicular to the first direction such that the movement of the first movable bar adjusts the size, location or shape of at least one of the mask holes.

12. The mask of claim 11, wherein the first movable bar has a width which is a distance between two opposite edges thereof measured in the second direction and is substantially same as or substantially smaller than that of the first support bar.

13. The mask of claim 11, wherein the plurality of support bars comprise a second support bar extending in the second direction and configured to support the first support bar.

14. The mask of claim 13, wherein the first support bar is disposed between the first movable bar and the second support bar at an overlapping location.

15. The mask of claim 13, wherein the first movable bar is disposed between the first and second support bars at an overlapping location.

16. The mask of claim 11, wherein the plurality of support bars comprise a second support bar extending in the second direction, wherein the plurality of movable bars comprise a second movable bar placed over the second support bar and extending in the first direction, the second movable bar being configured to move relative to the second support bar in the first direction such that the movement of the first movable bar adjusts the size or shape of at least one of the mask holes.

17. The mask of claim 16, wherein the second movable bar has a width which is a distance between two opposite edges thereof measured in the first direction and is substantially same as or substantially smaller than that of the second support bar, wherein the first support bar is disposed between the first movable bar and the second support bar at an overlapping location.

18. The mask of claim 16, wherein the first and second support bars are disposed between the first and second movable bars at an overlapping location.

19. A method of making a display device, the method comprising:
   placing the mask of claim 11;
   moving the first movable bar relative to the first support bar, thereby adjusting the size of at least one of the mask holes;
   providing a substrate;
   placing the mask over the substrate;
   depositing a deposition material over the substrate using the mask, wherein the deposition material passing the mask holes is deposited in predetermined areas.

20. The method of claim 19, wherein the deposition material is an organic light emitting material.

* * * * *